United States Patent
Hong et al.

(10) Patent No.: US 7,174,418 B2
(45) Date of Patent: Feb. 6, 2007

(54) SEMICONDUCTOR MEMORY DEVICE FOR ENHANCING REFRESH OPERATION IN HIGH SPEED DATA ACCESS

(75) Inventors: Sang-Hoon Hong, Ichon-shi (KR); Jin-Hong Ahn, Ichon-shi (KR); Jae-Bum Ko, Ichon-shi (KR); Se-Jun Kim, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 357 days.

(21) Appl. No.: 10/749,766

(22) Filed: Dec. 30, 2003

(65) Prior Publication Data

US 2004/0221100 A1    Nov. 4, 2004

(30) Foreign Application Priority Data

Apr. 30, 2003    (KR)    ............... 10-2003-0027654

(51) Int. Cl.
*G06F 12/00* (2006.01)
(52) U.S. Cl. ..................................... 711/106
(58) Field of Classification Search ............ None
See application file for complete search history.

(56) References Cited

U.S. PATENT DOCUMENTS

| | | |
|---|---|---|
| 5,165,029 A | 11/1992 | Sawai et al. |
| 5,226,009 A | 7/1993 | Arimoto |
| 5,469,555 A | 11/1995 | Ghosh et al. |
| 5,497,473 A | 3/1996 | Miyoshi et al. |
| 5,513,335 A | 4/1996 | McClure |
| 5,841,961 A | 11/1998 | Kozaru et al. |
| 6,215,685 B1 | 4/2001 | Fung et al. |
| 6,223,248 B1 | 4/2001 | Bosshart |
| 6,286,075 B1* | 9/2001 | Stracovsky et al. ............ 711/5 |
| 6,408,345 B1 | 6/2002 | Fuoco et al. |
| 6,412,044 B1 | 6/2002 | Kung |
| 6,452,823 B1 | 9/2002 | Naji |
| 6,557,080 B1* | 4/2003 | Burger et al. ............... 711/137 |
| 6,697,909 B1* | 2/2004 | Wang et al. ................ 711/106 |
| 2002/0141272 A1* | 10/2002 | Benedix et al. ............ 365/222 |

FOREIGN PATENT DOCUMENTS

| | | |
|---|---|---|
| JP | 02-217944 | 8/1990 |
| JP | 04-065739 | 3/1992 |
| JP | 05-012118 | 1/1993 |
| JP | 05-040691 | 2/1993 |
| JP | 05-073704 | 3/1993 |
| JP | 06-083704 | 3/1994 |

(Continued)

*Primary Examiner*—Hyung Sough
*Assistant Examiner*—Craig E Walter
(74) *Attorney, Agent, or Firm*—Blakely Sokoloff Taylor & Zafman (57) ABSTRACT

A semiconductor device for refreshing data stored in a memory device includes a cell area having N+1 number of unit cell blocks, each including M number of word lines which respectively are coupled to a plurality of unit cells; a tag block having N+1 number of unit tag blocks, each storing at least one physical cell block address denoting a row address storing a data; and a control block for controlling the tag block and the predetermined cell block table for refreshing the data in the plurality of unit cells coupled to a word line in response to the physical cell block address.

12 Claims, 7 Drawing Sheets

FOREIGN PATENT DOCUMENTS

| | | |
|---|---|---|
| JP | 07-049813 | 2/1995 |
| JP | 08-031195 | 2/1996 |
| JP | 08-212134 | 8/1996 |
| JP | 10-333982 | 12/1998 |
| JP | 11-283378 | 10/1999 |
| JP | 2001-188705 | 7/2001 |

* cited by examiner

SEMICONDUCTOR MEMORY DEVICE FOR ENHANCING REFRESH OPERATION IN HIGH SPEED DATA ACCESS

FIELD OF INVENTION

The present invention relates to a semiconductor memory device; and, more particularly, to a refresh operation of the semiconductor memory device for accessing stored data in high speed.

DESCRIPTION OF PRIOR ART

Generally, a semiconductor memory device is classified as a random access memory (RAM) and a read only memory (ROM).

The RAM includes a Dynamic RAM (DRAM) and a Static RAM (SRAM). One cell of the dynamic RAM has one transistor and one capacitor and that of the static RAM does four transistors and two load resistances. The DRAM is used more widespread than the SRAM because the DRAM is more efficient than SRAM in a chip integration and a manufacturing process.

Today, an operation speed of a central processing unit (CPU) is more dramatically advanced than that of the DRAM. As a result, many problems may arise because the operation speed of the memory device is slower than that of CPU. For overcoming these problems, several kinds of scheme in the memory device have been developed for a high speed data transmission.

Figure 1:
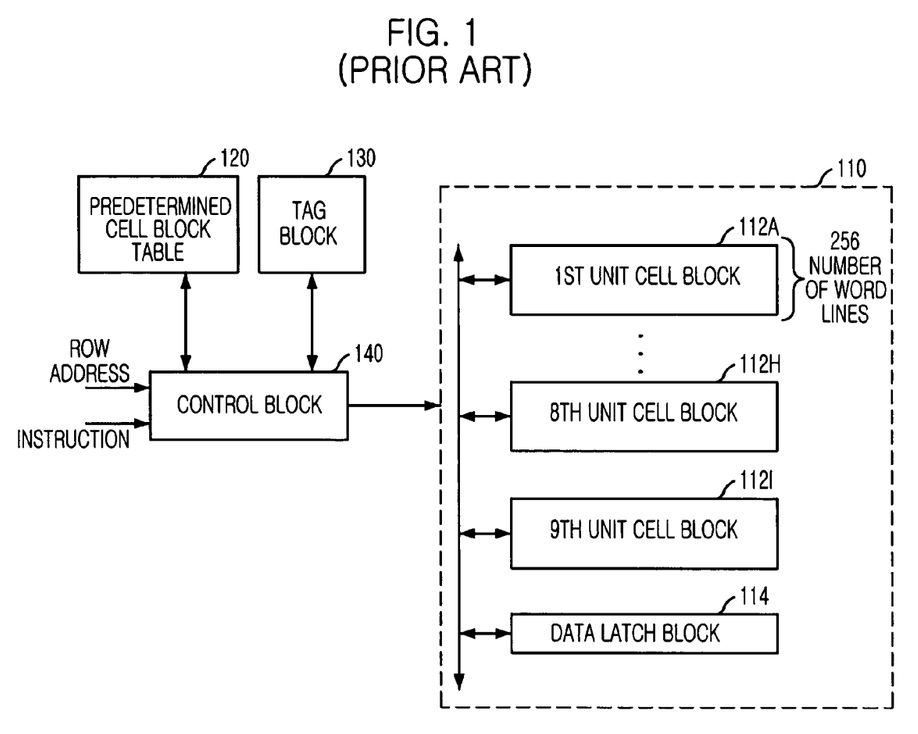
FIG. 1 is a block diagram showing a segment in a conventional semiconductor memory device.

FIG. 1 is a block diagram showing a segment in a conventional semiconductor memory device disclosed in a commonly owned copending application, U.S. Ser. No. 10/696,144, filed on Oct. 29, 2003, entitled "SEMICONDUCTOR MEMORY DEVICE WITH REDUCED DATA ACCESS TIME", which is incorporated herein by reference.

As shown, the bank includes a cell area 10, a tag block 30, a predetermined cell block table 20 and a control block 40. The cell area 10 has N+1 number of unit cell blocks and a data latch block 70. Also, in each unit cell block, M number of word lines is coupled to a plurality of unit cells. The N and M are positive integers. Herein, N is 8 and M is 256. In addition, a size of memory device, i.e., a storage capability, is calculated with the exception of the additional unit cell block. Namely, a size of the bank is M (number of word lines)×N (number of unit cell blocks)×(number of bit lines). The predetermined cell block table 20 includes a plurality of registers for storing predetermined restore cell block address information. The predetermined restore cell block address information contains at least one predetermined restore cell block address among (8+1)×256 word line addresses. The tag block 30 generates a target restore cell block address corresponding to an access cell block address based on the predetermined restore cell block address information. The control block 40 controls the predetermined cell block table 20, the cell area 10 and the tag block 30 in order to support an cell block interleaving mode which can make the memory device operate on high speed without reduction of data access time when at least two data accesses are sequentially occurred in the same bank.

Herein, the cell block interleaving mode is defined as an operation that, during a current data in response to a current instruction is restored in the original cell block or in another cell block, a next data in response to a next instruction is simultaneously outputted from the same cell block.

In addition, a row address inputted to the control block 40 of the memory device corresponds to 8×256 word lines; and the other word lines, i.e., 256 word lines of additional cell block are assigned as predetermined word lines. However, the predetermined word lines are not fixed but changed during an operation of the memory device.

Figure 2:
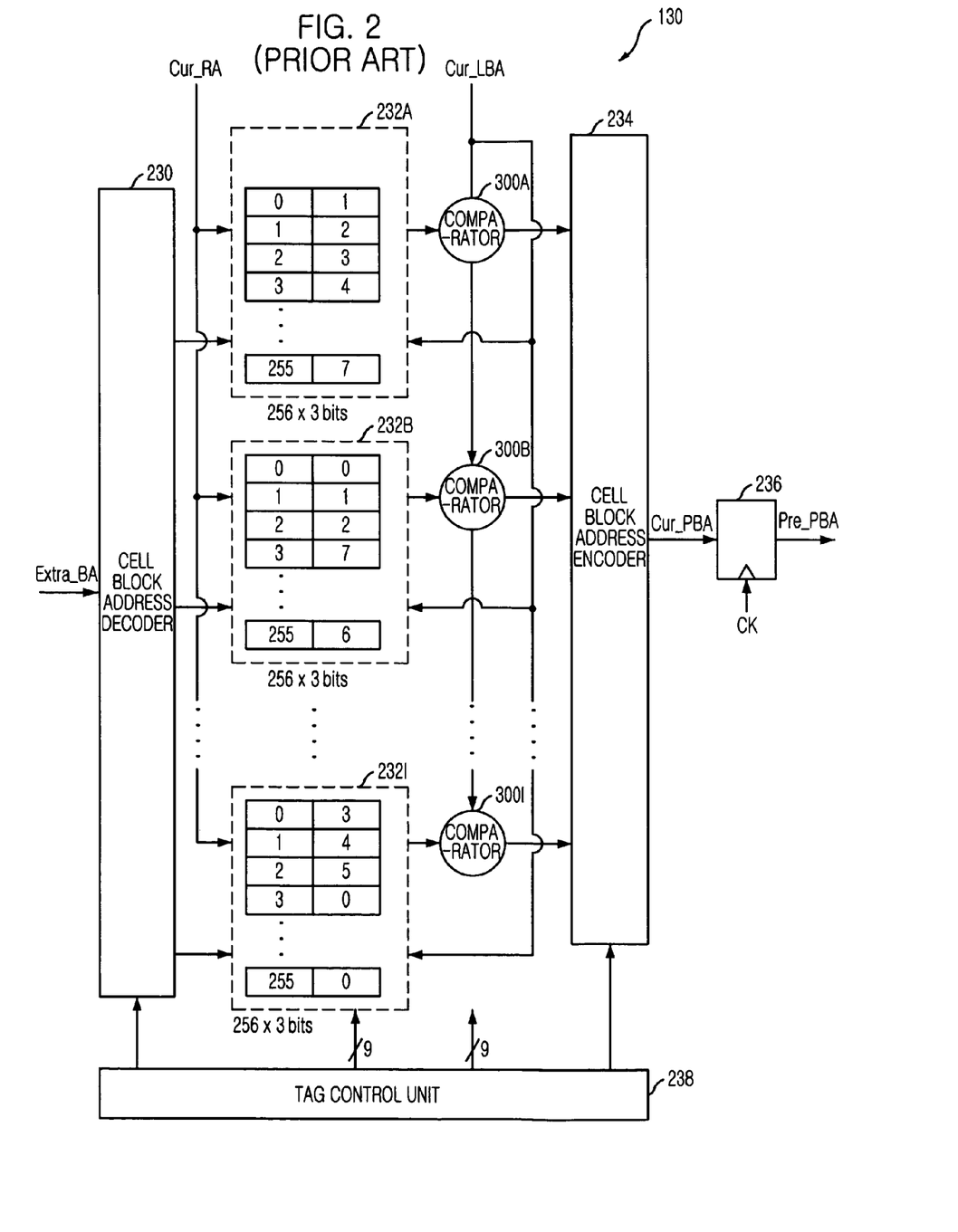
FIG. 2 is an exemplary block diagram describing a predetermined cell block table shown in FIG. 1.

FIG. 2 is a block diagram depicting a tag block 30 shown in FIG. 1.

As shown, the tag block 30 includes the 8+1 number of unit tag tables 232A to 232I, the 8+1 number of comparators 300A to 300I, a cell block address decoder 230, a cell block address encoder 234 and a tag control unit 238.

The cell block address decoder 230 receives an available restore cell block address Extra_BA outputted from the predetermined cell block table 20 and selects one among unit tag tables 232A to 232I in response to the available restore cell block address Extra_BA. Then, the comparator, e.g., 300A compares an address of converting a current row address Cur_RA based on the selected unit tag table with a logical cell block address Cur_LBA. And last, the cell block address encoder 234 outputs a current restore physical cell block address Cur_PBA which is encoded in response to a result of comparison. Herein, each of the unit tag tables 232A to 232I stores a restore cell block address information corresponding to N×256 word lines of unit cell blocks.

The tag block 130 further includes a delay unit 236 for delaying the current restore physical cell block Cur_PBA by one clock period to access a restore cell block.

Herein, each of unit tag tables 232A to 232I has 256 registers, and one register LBA consists of three bits because the number of the logical cell block addresses is 8. For instance, the first unit tag table 232A stores information what logical cell block is corresponded with each 256 numbers of the word lines included in the first unit cell block, and the second unit tag table 232B stores information what logical cell block is corresponded with each of 256 numbers of the word lines included in the second unit cell block.

In addition, in each unit tag table 232A to 232I, the first register 0 stores the logical cell block address in response to the word line 'WL0' of each unit cell block, the second register 1 stores the logical cell block address in response to the word line 'WL1' of each unit cell block, and 256th register 255 stores the logical cell block address in response to the word line 'WL255' of each unit cell block.

For example, referring to the first unit tag table 232A, first register 0 stores '1' and $255^{th}$ register 255 stores '7'. That is, in the first unit cell block, first word line WL0 corresponds with first word line WL0 of the second logical unit cell block and $255^{th}$ word line WL255 corresponds with $255^{th}$ word line WL255 of the eighth logical unit cell block.

Figure 3:
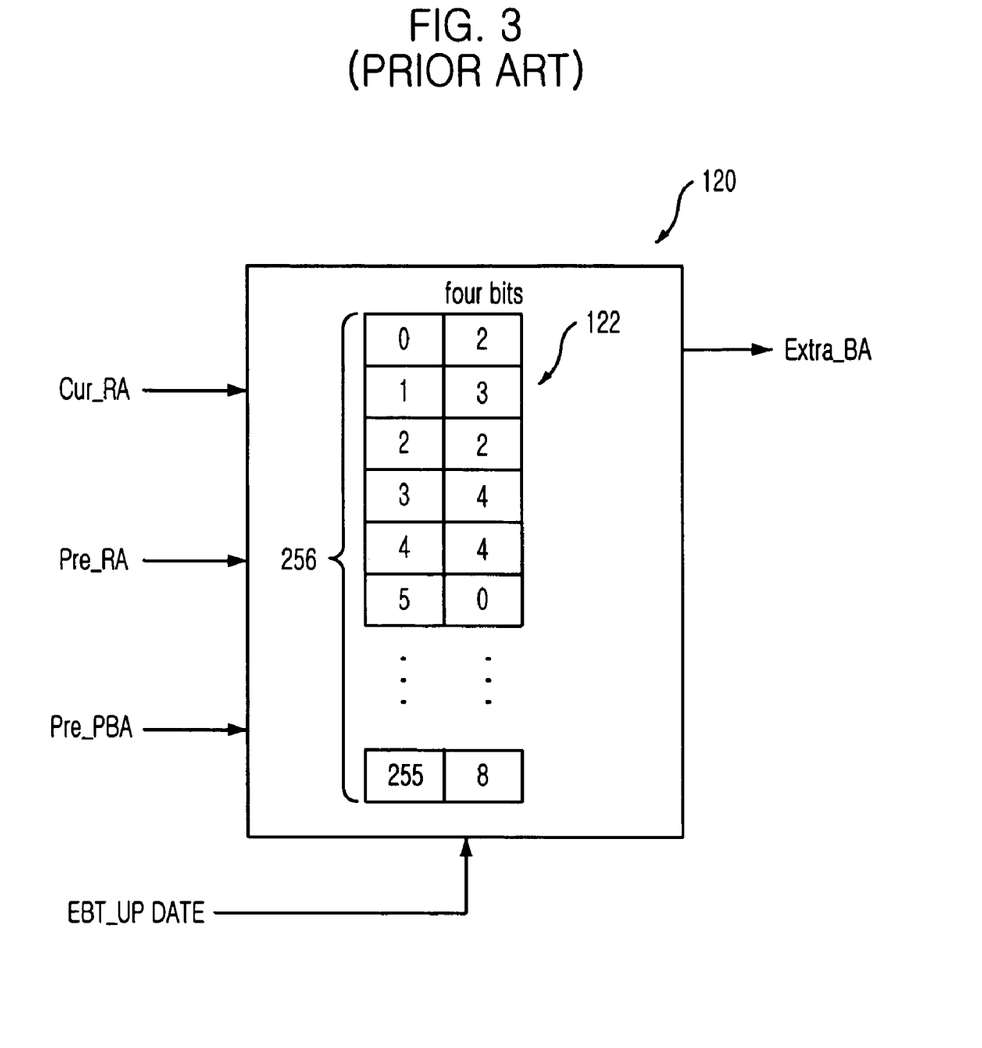
FIG. 3 is an exemplary block diagram depicting a tag block shown in FIG. 1.

FIG. 3 a block diagram describing the predetermined cell block table 20 shown in FIG. 1.

As shown, the predetermined cell block table 20 includes 256 registers, each having the predetermined restore cell block address information. The predetermined restore cell block address information contains a predetermined restore cell block address. The predetermined restore cell block address consists of 4 bits because the number of physical unit cell blocks is nine. The predetermined restore cell block address information represents a target cell block to be restored, corresponding to an accessed word line of unit cell block.

For instance, referring to the predetermined restore cell block address stored in each register, a first register 0 stores '1' and a second register 1 stores '3'. That is, a predetermined word line of a first word line WL0 is a first word line WL0 of the second unit cell block and a predetermined word line of a second word line WL1 is a second word line WL1 of the forth unit cell block. Herein, during the operation of the memory device, 256 registers of the predetermined cell block table are continuously updated.

The predetermined cell block table 20 receives a current row address Cur_RA, a previous row address Pre_RA and a previous restore physical cell block address Pre_PBA. Also, the predetermined cell block table 120 is updated by an updating signal EBT_UP DATE. The predetermined cell block table 120 outputs an available restore cell block address Extra_BA to the tag block 30.

Figure 4:
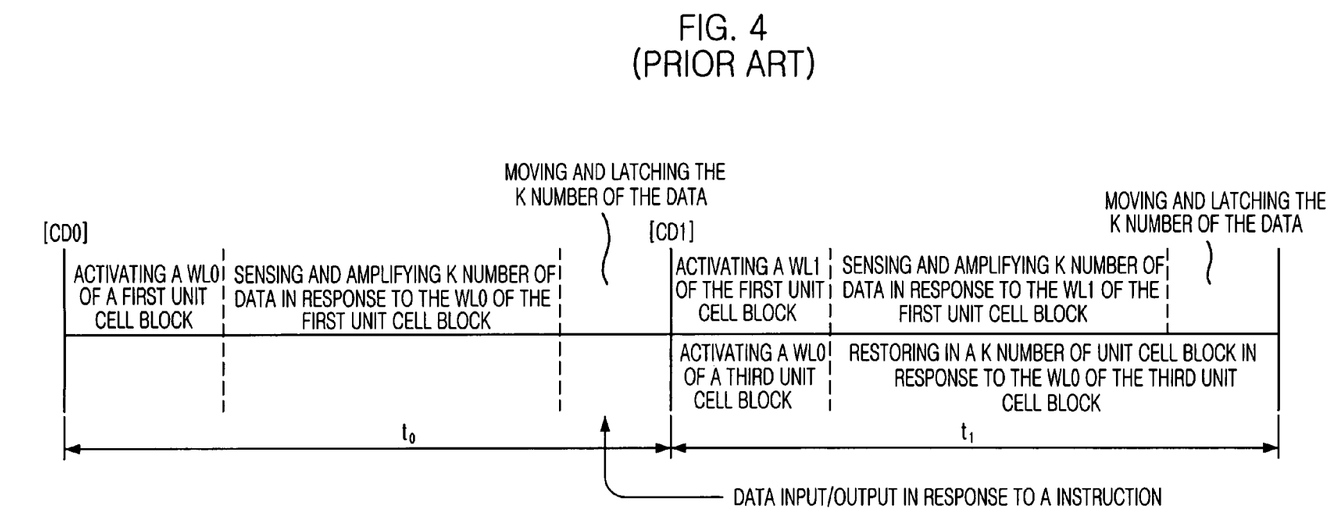
FIG. 4 is a timing diagram describing the operation of the memory device described in FIG. 1.

FIG. 4 is a timing diagram describing operation of the memory device shown in FIG. 1; and, especially, describes the intra cell block interleaving mode when a first and a second data are sequentially accessed in the same unit cell block among 8+1 numbers of the unit cell blocks shown in FIG. 1.

Hereinafter, referring to FIGS. 1 to 4, there is described the operation of the conventional memory device shown in FIG. 1.

Figure 5:
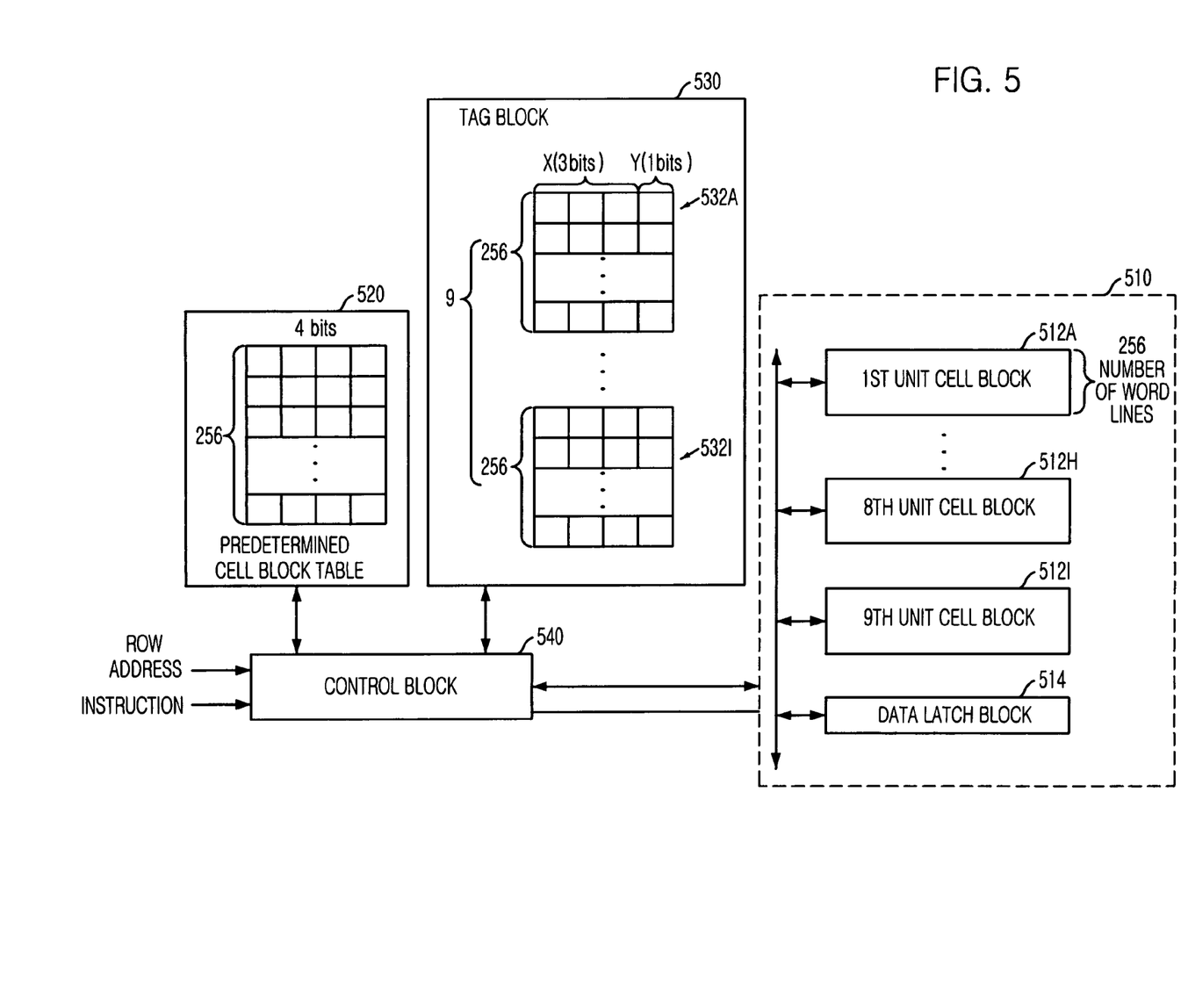
FIG. 5 is a block diagram showing a segment in a semiconductor memory device in accordance with the present invention.

The additional unit cell block is used for restoring the first data when the second data are sequentially accessed in the same unit cell block. As shown in FIG. 5, the first data is stored in unit cells coupled to a first word line WL0, and the second data is stored in unit cells coupled to a second word line WL1 of the same unit cell block.

First, at a first timing period t0, the first word line WL0 of, e.g., first unit cell block 1630_1 is activated in response to a first instruction CD0; and, then, first data in response to the first word line WL0 is sensed and amplified. The amplified first data moves to the data latch block 1670.

If the first instruction CD0 is a read instruction, data in response to the first instruction CD0 among K number of data latched in the data latch block 70 is outputted; otherwise, i.e., if the first instruction CD0 is a write instruction, data in response to the first instruction CD0 among K number of data latched in the data latch block 70 is overwritten by an inputted data of external circuit.

At a second timing period t1, first, the second word line WL1 of, e.g., first unit cell block 1630_1 is activated in response to a second instruction CD1; and, at the same time, the first word line WL0 of, e.g., third unit cell block 1630_3 is activated.

Then, the second data in response to the second word line WL1 is sensed and amplified; and, at the same time, the first data is restored into unit cells in response to the first word line WL0 of the third unit cell block 1630_1.

As described above, the data access time of the conventional memory device can be actually precluded the data restoration time, because the second data can be sensed and amplified by the next instruction during the first data in response to the present instruction is restored. Thus, the data access time can be effectively reduced to thereby obtain a high speed operation of the memory device. In addition, in the conventional memory device, the data restoration operation can be simplified by simply changing only the cell block address of the data.

In the other hand, hereinafter, there is described the inter cell block interleaving mode when a third and a forth data are sequentially accessed in each different unit cell block among 8+1 numbers of the unit cell blocks (not shown).

Contrary to the intra cell block interleaving mode, the third data outputted from a unit cell block is stored in the original unit cell block at the same timing of outputting the forth data from another unit cell block.

In this case, the data access time of the conventional memory device can be actually precluded the data restoration time, because the forth data can be sensed and amplified by the next instruction during the third data in response to the present instruction is restored.

In the conventional memory device, a capacitor is used for storing data. Namely, in the conventional memory device, a refresh operation should be carried out in order to avoid losing the stored data in a unit cell.

The conventional memory device shown in FIG. 1 performs the refresh operation in each unit cell block which is not accessed by inputted instruction and address. Namely, during a period of not accessing stored data, all word lines of each unit cell block is activated in order; data in response to an activated word line is sensed and amplified; and the amplified data is restored in original unit cells or other unit cells.

Herein, when data is accessed in the conventional memory device, all word lines of each unit cell block are activated. Namely, it is unnecessary to activate some of word lines included in each unit cell block because it is a rare case that data are stored in all of unit cells in each unit cell block. As a result, it is undesirable to activating all word lines in each the unit cell block for the refresh operation, unrelated to whether unit cells in response to an activated word line store data or not.

SUMMARY OF INVENTION

It is, therefore, an object of the present invention to provide a method and an apparatus of a memory device for reducing operation time of a refresh operation in order to accessing data on high speed so that the data restoration time does not affect seriously the data access time.

In accordance with an aspect of the present invention, there is provided a semiconductor device for refreshing data stored in a memory device includes a cell area having N+1 number of unit cell blocks, each including M number of word lines which respectively are coupled to a plurality of unit cells; a tag block having N+1 number of unit tag blocks, each storing at least one physical cell block address denoting a row address storing a data; and a control block for controlling the tag block and the predetermined cell block table for refreshing the data in the plurality of unit cells coupled to a word line in response to the physical cell block address.

In accordance with another aspect of the present invention, there is provided a method for a refresh operation of a semiconductor memory device including a cell area having N+1 number of unit cell blocks, each including M number of word lines which respectively are coupled to a plurality of unit cells; a tag block having N+1 number of unit tag blocks, each having M number of register for sensing an update of data, comprising the steps of: (A) starting a refresh mode; (B) finding at least one physical block address by decoding (N+1)×M number of second register each storing logical block address; and (C) performing the refresh operation in the selected unit cell block.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device having a tag block according to the present invention will be described in detail referring to the accompanying drawings.

FIG. 5 is a block diagram showing a segment in a semiconductor memory device in accordance with the present invention.

As shown, the segment includes a predetermined cell block table 520, a tag block 530, a control block 540 and a cell area 510.

The cell area 510 has N+1 number of unit cell blocks 512A to 512I, each including M number of word lines for responding to a row address. Herein, N and M are positive integers, e.g., 8 and 256. Also, the cell area 510 further has a data latch block 514 for latching outputted data from each unit cell block or inputted data from an external circuit.

The predetermined cell block table 520 having 256 number of first registers is used for storing information, wherein at least more than one word line among the (N+1)×M number of the word lines is assigned as a predetermined restorable word line by using the information. Each first register has 4 bits because the cell area 510 is constituted with nine unit cell blocks. Namely, the predetermined cell block table 520 includes M number of first registers for storing information what unit cell block out of the N+1 number of the physical unit cell blocks has the M number of the predetermined word lines, each first register having 3+1 bits.

The tag block 530 receives the row address, senses a logical cell block address designated for accessing one of N number of unit cell blocks and converts the logical cell block address into a physical cell block address designated for accessing one of the N+1 number of unit cell blocks and outputting the physical cell block address. Herein, a refresh operation is performed in unit cells coupled to a word line in response to the physical cell block address stored in the tag block. That is, the tag block 530 has N+1 number of unit tag blocks, each storing at least one physical cell block address denoting a row address storing a data.

The control block 540 controls the tag block 530 and the predetermined cell block table 520 for activating one word line of a unit cell block selected by the physical cell block address.

Figure 6:
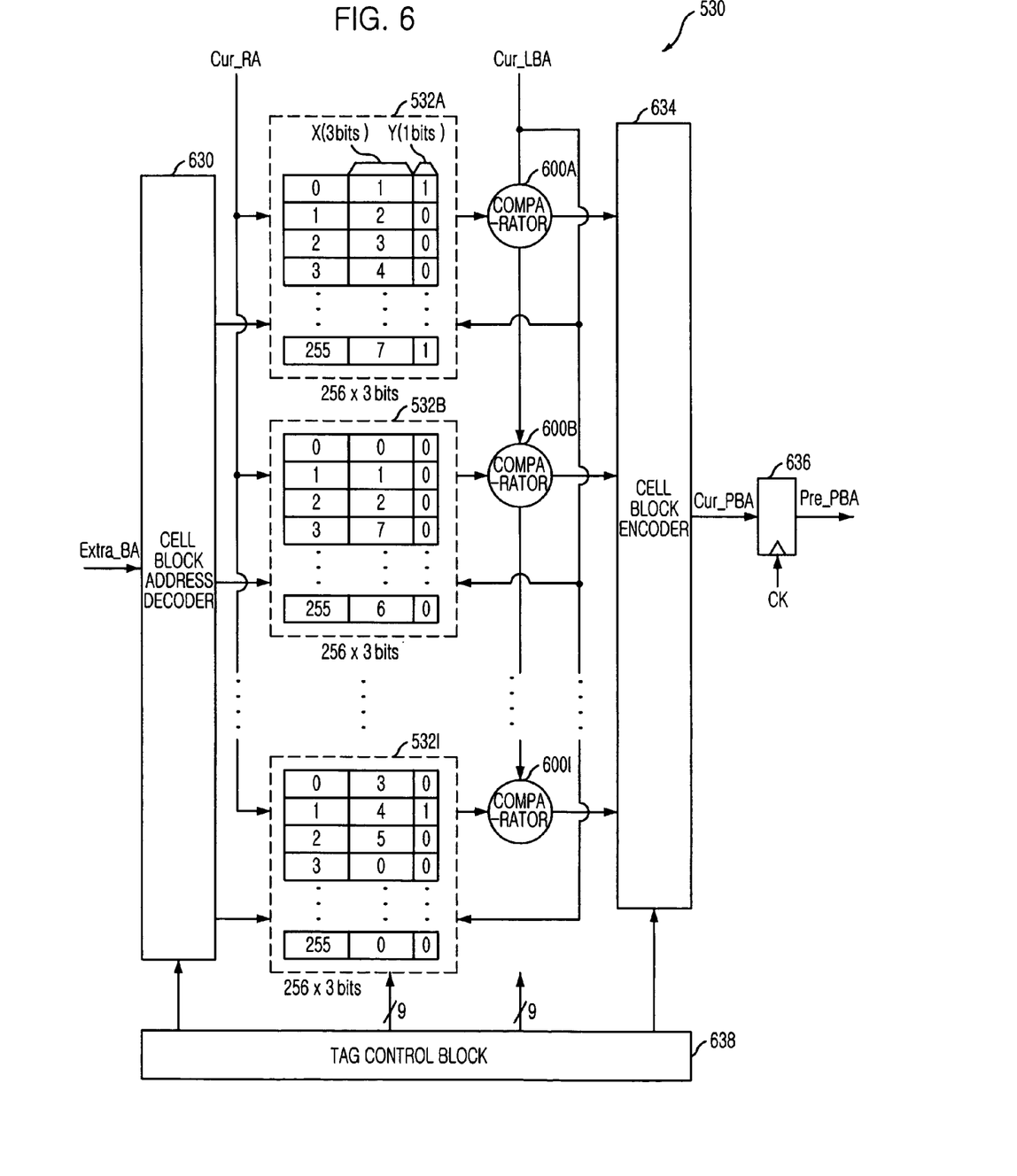
FIG. 6 is a detailed block diagram depicting a tag block in the semiconductor memory device in accordance with the present invention.

FIG. 6 is a detailed block diagram depicting the tag block 530 in the semiconductor memory device in accordance with the present invention.

As shown, the tag block 530 includes a cell block address decoder 630, an N+1 number of unit tag tables 532A to 532I, an N+1 number of comparators 600A to 600I, a cell block address encoder 634 and a tag control block 638.

The tag block 530 further includes a delay unit 636 for delaying the current restore physical cell block Cur_PBA by one clock period to access a restore cell block.

The tag block 530 of the present invention is similar to that of the prior art shown in FIG. 2 except for the N+1 number of unit tag tables 532A to 532I. Thus, the N+1 number of unit tag tables 532A to 532I is only described at here.

Herein, the tag block 530 includes nine unit tag tables 532A to 532I corresponding with the first to ninth unit cell block 512A to 512I of the cell area 510 shown in FIG. 5. Each unit tag table also has 256 second registers corresponding with the number of word lines included in each unit cell block, e.g., 512A. Each second register is constituted with a third register having X bits for storing the logical cell block address in response to the N number of unit cell blocks, wherein X is at least $\log_2 N$; and a forth register for sensing an update of data stored in the third register. Herein, N is 8. So, the third register is 3 bits.

Figure 7:
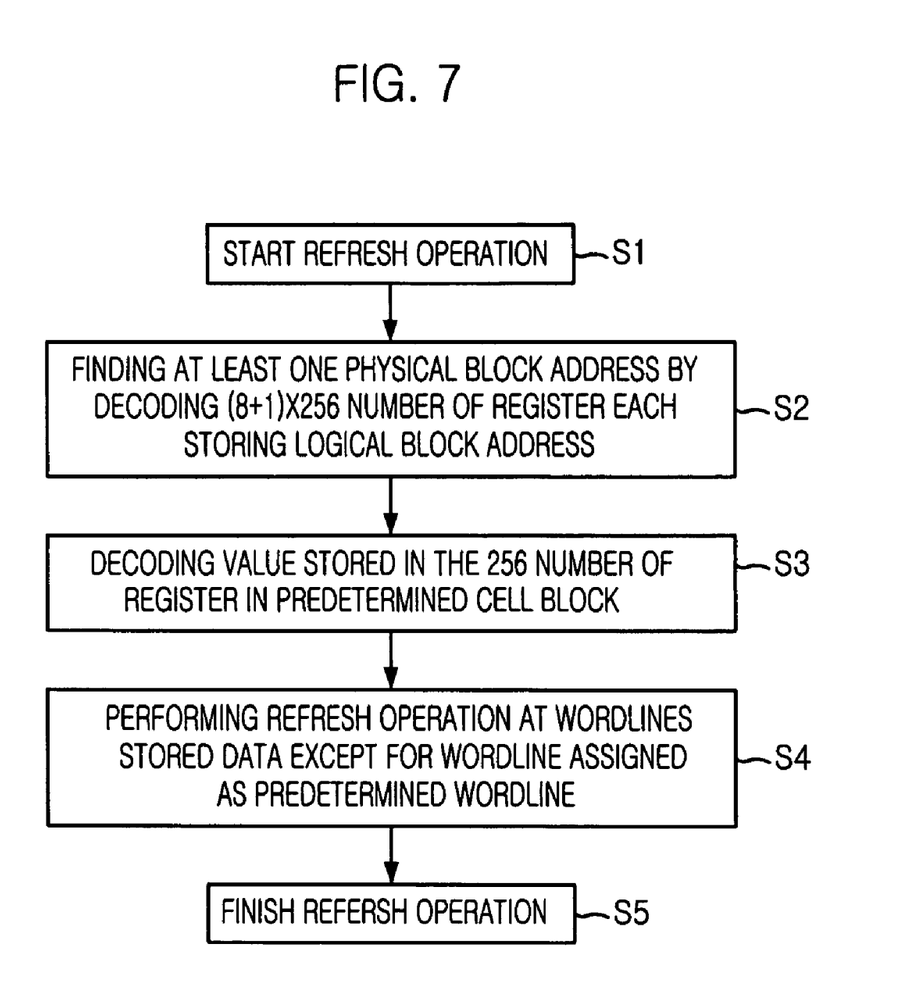
FIG. 7 is a flow chart describing a refresh operation of the semiconductor memory device in accordance with the present invention.

FIG. 7 is a flow chart describing a refresh operation of the semiconductor memory device in accordance with the present invention. Hereinafter, referring to FIGS. 5 to 7, the refresh operation of the semiconductor memory device in accordance with the present invention is described in detail.

The refresh operation of a semiconductor memory device includes the first step S1 of starting a refresh mode; the second step S2 of finding at least one physical block address by decoding (N+1)×M number of second register each storing logical block address; the third step S3 of decoding value stored in the M number of the first register in the predetermined cell block and; and the forth step S4 of performing the refresh operation at the word line of the selected physical block address except for word lines assigned as the predetermined word line. Herein, N is 8 and M is 256.

In addition, the second step S2 includes the fifth step of decoding the M number of third registers in the predetermined cell block in order to find out that the M number of predetermined word lines is respectively assigned to which unit cell block among the N+1 number of unit cell blocks.

As described above, in the present invention, it is sensed whether the data is stored in unit cells coupled to each word line or not. As a result, the operation time for the refresh operation is dramatically reduced because the refresh operation can be performed at only unit cells storing data.

For sensing the unit cells storing the data, i.e., a word line coupled to the unit cells storing the data, each second register included in the unit tag table has 4 bits, i.e., the third register (3 bits) and the forth register (1 bit). Thus, the unit tag table, e.g., 432A is a memory cell of which size is 4×256 bits.

If the data stored in a first word line is accessed, a second register of the unit tag table in response to the first word line is used for converting the logical cell block address to the physical cell block address. Whenever the data is accessed, a forth register in the second register in response to the first word line is updated. For example, if the data is stored in the unit cells in response to the first word line converted by the second register '0' of the first unit tag table 432A, the forth resister included in the second register '0' is updated as '1'. Then, during the refresh operation, if each forth register in the unit tag table is '1', it can be easily known that unit cells in response to the forth register store the data.

In addition, the semiconductor memory device of the present invention uses the predetermined tag table 520 for accessing data in high speed. In the predetermined tag table 520, there are 256 first register for a data restoration.

If a word line of unit cell block, e.g., 512A is assigned as the predetermined word line, the refresh operation is unnecessary at unit cells in response to the word line. Therefore, the refresh operation should be performed except for word lines assigned as the M number of the predetermined word line in the predetermined tag table 520.

Consequently, the refresh operation is performed at word lines in response to the forth registers (storing '1') of the unit tag table except for word lines assigned as the predetermined word line.

As a result, by reducing the operation time for the refresh operation, the semiconductor memory device having the tag block in accordance with the present invention is operated in more high speed and reduces power consumption.

While the present invention has been described with respect to the particular embodiments, it will be apparent to those skilled in the art that various changes and modification may be made without departing from the spirit and scope of the invention as defined in the following claims.

What is claimed is:

1. A semiconductor device for refreshing data stored in a memory device, comprising:
   a cell area having N+1 number of unit cell blocks, each including M number of word lines which respectively are coupled to a plurality of unit cells wherein the N number of unit cell blocks are corresponded to logical cell block addresses and one unit cell block is added for accessing data with high speed;
   a predetermined cell block table for assigning M number of word lines among the (N+1)×M number of the word lines as predetermined restorable word lines;
   a tag block having N+1 number of unit tag blocks, each unit tag block storing at least one physical cell block address storing data wherein the tag block receives a logical cell block address designated for accessing one of N number of unit cell blocks and converts the logical cell block address into a physical cell block address designated for accessing one of the N+1 number of unit cell blocks; and
   a control means for activating one word line of a unit cell block selected by the physical cell block address and a corresponding one of the predetermined restorable word lines by controlling the tag block and the predetermined cell block table,
   wherein the tag block stores information representing an update of the logical cell block address and a refresh operation is preformed through the use of the information.

2. The semiconductor device as recited in claim 1 wherein the corresponding one of the predetermined restorable word lines is located at a unit cell block except for the unit cell block selected by the physical cell block address.

3. The semiconductor memory device as recited in claim 1, wherein the tag block includes:
   an N+1 number of unit tag tables corresponded to the N+1 unit cell blocks, each unit tag table having M number of registers for storing the at least one physical cell block address denoting a row address storing data;
   an N+1 number of comparators corresponded to the N+1 number of unit tag blocks, each comparator for comparing address information stored in registers of the corresponding unit tag table with a logical cell block address sensed by the row address wherein the address information is the at least one physical cell block address denoting the row address storing the data;
   an encoder for outputting the at least one physical cell block address by encoding results compared by the N+1 number of comparators; and
   a tag control block for controlling the N+1 number of the unit tag tables, the N+1 number of the comparators, and the encoder.

4. The semiconductor memory device as recited in claim 3, wherein each register of a unit tag table includes:
   a first register having X bits for storing the logical cell block address representing a unit cell block, wherein X is at least $\log_2 N$; and
   a second register for storing information representing an update of data stored in the first register.

5. The semiconductor memory device as recited in claim 3, wherein the tag block further includes:
   a decoder for receiving candidate information and outputting the logical cell block address.

6. The semiconductor memory device as recited in claim 4, wherein the predetermined cell block table includes M number of third registers for storing information indicating which word lines of (N+1)×M word lines included in the N+1 number of the physical unit cell blocks are the M number of the predetermined restorable word lines, each third register having X+1 bits.

7. A method for a refresh operation of a semiconductor memory device including a cell area having N+1 number of unit cell blocks, each including M number of word lines which respectively are coupled to a plurality of unit cells; a predetermined cell block table for assigning M number of word lines among (N+1)×M number of the word lines as predetermined restorable word lines; and a tag block for storing a physical cell block address, the tag block having N+1 number of unit tag blocks, each having M number of registers for sensing an update of data, wherein one word line of a unit cell block selected by the physical cell block address and a corresponding one of the predetermined restorable word lines are activated, comprising the steps of:
   (A) starting a refresh mode;
   (B) detecting word lines determined by the physical cell block address having data by checking (N+1)×M number of registers in the tag block, each register storing a logical block address and an information representing update of the logical block address; and
   (C) performing the refresh operation through the use of the information,
   wherein the N number of unit cell blocks are corresponded to addresses and one unit cell block is added for accessing data with high speed.

8. The method as recited in claim 7, wherein the step (C), includes the step of
   (D) denoting M number of registers in the predetermined cell block table in order to find out an address representing the M number of predetermined restorable word lines assigned among (N+1)×M word lines of the N+1 number of unit cell blocks,
   wherein the refresh operation is performed except for the address representing the M number of the predetermined restorable word lines.

9. The method as recited in claim 7, wherein the corresponding one of the predetermined restorable word lines is located at a unit cell block except for the unit cell block selected by the physical cell block address.

10. The method as recited in claim 9, wherein the information represents which one of two activated word lines has real data.

11. The method as recited in claim 10, wherein in the step (C), the refresh operation is only performed to the word line having the real data.

12. The semiconductor device as recited in claim 1, wherein the information represents which one of two activated word lines has real data.

* * * * *

UNITED STATES PATENT AND TRADEMARK OFFICE
CERTIFICATE OF CORRECTION

PATENT NO. : 7,174,418 B2  Page 1 of 1
APPLICATION NO. : 10/749766
DATED : February 6, 2007
INVENTOR(S) : Hong et al.

It is certified that error appears in the above-identified patent and that said Letters Patent is hereby corrected as shown below:

Col. 7, line 44 in Claim #2, please delete "claim 1 wherein" and insert -- claim 1, wherein --.

Signed and Sealed this

Third Day of June, 2008

JON W. DUDAS
*Director of the United States Patent and Trademark Office*